(12) United States Patent
Rikiso et al.

(10) Patent No.: US 11,014,165 B2
(45) Date of Patent: May 25, 2021

(54) CUTTING TOOL

(71) Applicant: SUMITOMO ELECTRIC HARDMETAL CORP., Itami (JP)

(72) Inventors: Yuki Rikiso, Itami (JP); Susumu Okuno, Itami (JP); Anongsack Paseuth, Itami (JP); Shinya Imamura, Itami (JP)

(73) Assignee: SUMITOMO ELECTRIC HARDMETAL CORP., Itami (JP)

( * ) Notice: Subject to any disclaimer, the term of this patent is extended or adjusted under 35 U.S.C. 154(b) by 0 days.

(21) Appl. No.: 17/042,951

(22) PCT Filed: Nov. 1, 2019

(86) PCT No.: PCT/JP2019/043092
§ 371 (c)(1),
(2) Date: Sep. 29, 2020

(87) PCT Pub. No.: WO2020/174756
PCT Pub. Date: Sep. 3, 2020

(65) Prior Publication Data
US 2021/0046554 A1 Feb. 18, 2021

(30) Foreign Application Priority Data

Feb. 26, 2019 (JP) .............................. JP2019-032643

(51) Int. Cl.
*B23B 27/14* (2006.01)
*B23C 5/16* (2006.01)
(Continued)

(52) U.S. Cl.
CPC ................ *B23B 27/14* (2013.01); *B23C 5/16* (2013.01); *C23C 16/308* (2013.01); *C23C 16/32* (2013.01);
(Continued)

(58) Field of Classification Search
CPC .... B23B 27/14; B23B 2224/04; C23C 16/403
(Continued)

(56) References Cited

U.S. PATENT DOCUMENTS

| 2002/0122701 A1* | 9/2002 | Ljungberg ............ C23C 30/005 407/118 |
| 2014/0193624 A1 | 7/2014 | Stiens et al. |

(Continued)

FOREIGN PATENT DOCUMENTS

| WO | 2013/037997 A1 | 3/2013 |
| WO | 2014/054591 A1 | 4/2014 |

(Continued)

OTHER PUBLICATIONS

Written Opinion of the International Searching Authority dated Jan. 21, 2020 in International Patent Application No. PCT/JP2019/043092, 6 pages.

*Primary Examiner* — Archene A Turner
(74) *Attorney, Agent, or Firm* — Xsensus LLP

(57) ABSTRACT

A cutting tool includes a substrate and a coating that covers the substrate, the coating includes an $\alpha$-$Al_2O_3$ layer, and the $\alpha$-$Al_2O_3$ layer has an orientation index TC(0 0 12) of a (0 0 12) plane not smaller than 4 and not larger than 8.5, an orientation index TC(2 0 14) of a (2 0 14) plane not smaller than 0.5 and not larger than 3, and a total of the orientation index TC(0 0 12) and the orientation index TC(2 0 14) not larger than 9.

6 Claims, 3 Drawing Sheets

(51) Int. Cl.
*C23C 16/30* (2006.01)
*C23C 16/40* (2006.01)
*C23C 16/32* (2006.01)
*C23C 28/00* (2006.01)
*C23C 16/34* (2006.01)

(52) U.S. Cl.
CPC .......... *C23C 16/342* (2013.01); *C23C 16/403* (2013.01); *C23C 28/347* (2013.01); *B23B 2224/04* (2013.01); *B23C 2224/04* (2013.01)

(58) Field of Classification Search
USPC ........... 51/307, 309; 428/336, 698, 701, 702
See application file for complete search history.

(56) References Cited

U.S. PATENT DOCUMENTS

| | | |
|---|---|---|
| 2015/0240353 A1 | 8/2015 | Fukunaga et al. |
| 2016/0136786 A1* | 5/2016 | Bjormander .......... C23C 30/005 51/309 |
| 2020/0038964 A1 | 2/2020 | Satoh et al. |

FOREIGN PATENT DOCUMENTS

| | | |
|---|---|---|
| WO | 2018/079229 A1 | 5/2018 |
| WO | 2018/224487 A1 | 12/2018 |

\* cited by examiner

CUTTING TOOL

CROSS-REFERENCE TO RELATED APPLICATIONS

The present application is based on PCT filing PCT/JP2019/043092, filed Nov. 1, 2019, which claims priority to JP 2019-032643, filed Feb. 26, 2019, the entire contents of each are incorporated herein by reference.

TECHNICAL FIELD

The present disclosure relates to a cutting tool.

BACKGROUND ART

Various studies have conventionally been conducted in order to achieve longer life of a cutting tool. For example, WO 2013/037997 (PTL 1) discloses a cutting tool including a substrate and a coating formed on a surface of the substrate.

CITATION LIST

Patent Literature

PTL 1: WO 2013/037997

SUMMARY OF INVENTION

A cutting tool according to the present disclosure includes a substrate and a coating that covers the substrate, the coating includes an $\alpha$-$Al_2O_3$ layer, and the $\alpha$-$Al_2O_3$ layer has an orientation index TC(0 0 12) of a (0 0 12) plane expressed in an expression (1) below not smaller than 4 and not larger than 8.5, an orientation index TC(2 0 14) of a (2 0 14) plane expressed in an expression (2) below not smaller than 0.5 and not larger than 3, and a total of orientation index TC(0 0 12) and orientation index TC(2 0 14) not larger than 9

$$TC(0\ 0\ 12) = \frac{I(0\ 0\ 12)}{I_0(0\ 0\ 12)} \left\{ \frac{1}{9} \sum_{n=1}^{9} \frac{I(h\ k\ l)}{I_0(h\ k\ l)} \right\}^{-1} \quad (1)$$

$$TC(2\ 0\ 14) = \frac{I(2\ 0\ 14)}{I_0(2\ 0\ 14)} \left\{ \frac{1}{9} \sum_{n=1}^{9} \frac{I(h\ k\ l)}{I_0(h\ k\ l)} \right\}^{-1} \quad (2)$$

where I(h k l) represents X-ray diffraction intensity found in XRD measurement at an (h k l) plane, $I_0$(h k l) represents standard intensity at the (h k l) plane of $\alpha$-$Al_2O_3$ shown in 010-0173 of JCPDS card, and the (h k l) plane refers to any of nine planes of a (0 1 2) plane, a (1 0 4) plane, a (1 1 0) plane, a (1 1 3) plane, a (0 2 4) plane, a (1 1 6) plane, a (3 0 0) plane, the (0 0 12) plane, and the (2 0 14) plane.

DETAILED DESCRIPTION

Figure 1:
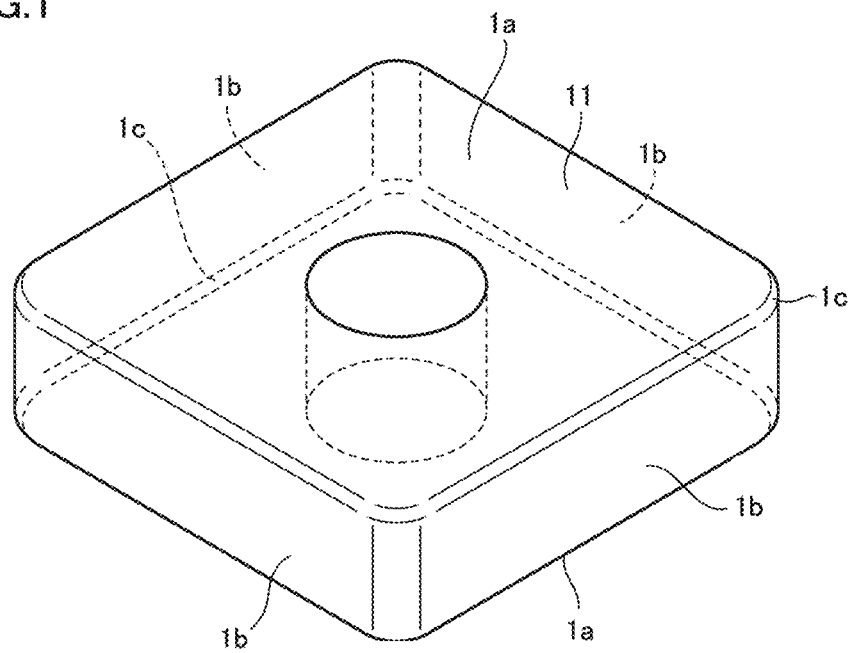
FIG. 1 is a perspective view illustrating one manner of a substrate of a cutting tool.

Problem to be Solved by the Present Disclosure

In PTL 1, performance (for example, wear resistance and chipping resistance) of a cutting tool is improved by providing on a substrate, an $\alpha$-$Al_2O_3$ layer or the like in which (0 0 1) orientation is dominant. In order for the cutting tool to sufficiently benefit from improvement in wear resistance owing to the $\alpha$-$Al_2O_3$ layer, however, in parallel to the above, improvement in chipping resistance owing to the $\alpha$-$Al_2O_3$ layer (in particular, improvement in resistance against force applied to a coating in a direction perpendicular to an interface (a main surface) of the $\alpha$-$Al_2O_3$ layer during cutting) is also important. Under such circumstances, further improvement in cutting tool provided with a coating on its surface has been demanded.

The present disclosure was made in view of such circumstances, and an object thereof is to provide a cutting tool excellent in wear resistance and chipping resistance.

Advantageous Effect of the Present Disclosure

According to the above, a cutting tool excellent in wear resistance and chipping resistance can be provided.

DESCRIPTION OF EMBODIMENT OF THE PRESENT DISCLOSURE

Contents of one manner of the present disclosure will initially be listed and described.

[1] A cutting tool according to one manner of the present disclosure includes a substrate and a coating that covers the substrate, the coating includes an $\alpha$-$Al_2O_3$ layer, and the $\alpha$-$Al_2O_3$ layer has an orientation index TC(0 0 12) of a (0 0 12) plane expressed in an expression (1) below not smaller than 4 and not larger than 8.5, an orientation index TC(2 0 14) of a (2 0 14) plane expressed in an expression (2) below not smaller than 0.5 and not larger than 3, and a total of orientation index TC(0 0 12) and orientation index TC(2 0 14) not larger than 9

$$TC(0\ 0\ 12) = \frac{I(0\ 0\ 12)}{I_0(0\ 0\ 12)} \left\{ \frac{1}{9} \sum_{n=1}^{9} \frac{I(h\ k\ l)}{I_0(h\ k\ l)} \right\}^{-1} \quad (1)$$

$$TC(2\ 0\ 14) = \frac{I(2\ 0\ 14)}{I_0(2\ 0\ 14)} \left\{ \frac{1}{9} \sum_{n=1}^{9} \frac{I(h\ k\ l)}{I_0(h\ k\ l)} \right\}^{-1} \quad (2)$$

where I(h k l) represents X-ray diffraction intensity found in XRD measurement at an (h k l) plane, $I_0$(h k l) represents standard intensity at the (h k l) plane of $\alpha$-$Al_2O_3$ shown in 010-0173 of JCPDS card, and the (h k l) plane refers to any of nine planes of a (0 1 2) plane, a (1 0 4) plane, a (1 1 0) plane, a (1 1 3) plane, a (0 2 4) plane, a (1 1 6) plane, a (3 0 0) plane, the (0 0 12) plane, and the (2 0 14) plane.

With the construction as described above, the cutting tool achieves improved resistance against development of a crack of the α-Al$_2$O$_3$ layer while maintaining high hardness. Consequently, the cutting tool is excellent in wear resistance and chipping resistance.

[2] Preferably, orientation index TC(2 0 14) is not smaller than 1 and not larger than 2.5. By defining as such, the cutting tool is further excellent in chipping resistance.

[3] Preferably, the α-Al$_2$O$_3$ layer has a thickness not smaller than 1 μm and not larger than 20 μm. By defining as such, the cutting tool is further excellent in wear resistance while it satisfactorily maintains adhesiveness between the coating and the substrate.

[4] Preferably, the coating further includes an intermediate layer provided between the substrate and the α-Al$_2$O$_3$ layer, and the intermediate layer contains an oxycarbide, an oxycarbonitride, or a boronitride containing titanium as a constituent element. By defining as such, the cutting tool is further excellent in adhesiveness between the substrate and the α-Al$_2$O$_3$ layer, in addition to wear resistance.

[5] Preferably, the coating has a thickness not smaller than 1 μm and not larger than 30 μm. By defining as such, the cutting tool is further excellent in wear resistance while it satisfactorily maintains adhesiveness between the coating and the substrate.

[6] Preferably, the coating further includes an outermost layer formed on the α-Al$_2$O$_3$ layer. By defining as such, the cutting tool is excellent in identifiability of the coating in addition to wear resistance.

Details of Embodiment of the Present Disclosure

One embodiment of the present disclosure (hereinafter denoted as the "present embodiment") will be described hereinafter, however, the present embodiment is not limited thereto. In the drawings used for description of the embodiment below, the same or corresponding elements have the same reference characters allotted. An expression in a form "A to B" herein means the upper limit and the lower limit of the range (that is, not less than A and not more than B). When a unit for A is not given and a unit is given only for B, the unit for A and the unit for B are the same. When a compound is expressed in a chemical formula that does not limit a ratio of a constituent element such as "TiN" herein, the chemical formula encompasses every composition (atomic ratio) that has conventionally been known. At this time, the chemical formula encompasses not only a stoichiometric composition but also a non-stoichiometric composition. For example, a chemical formula "TiN" encompasses not only a stoichiometric composition "Ti$_1$N$_1$" but also a non-stoichiometric composition such as "Ti$_1$N$_{0.8}$". This is also applicable to an expression of a compound other than "TiN".

<<Surface-Coated Cutting Tool>>

A cutting tool according to the present embodiment includes a substrate and a coating that covers the substrate, the coating includes an α-Al$_2$O$_3$ layer, and the α-Al$_2$O$_3$ layer has orientation index TC(0 0 12) of the (0 0 12) plane expressed in the expression (1) not smaller than 4 and not larger than 8.5, orientation index TC(2 0 14) of the (2 0 14) plane expressed in the expression (2) not smaller than 0.5 and not larger than 3, and the total of orientation index TC(0 0 12) and orientation index TC(2 0 14) not larger than 9.

A surface-coated cutting tool (which may simply be referred to as a "cutting tool" below) in the present embodiment includes a substrate and a coating that covers the substrate. The cutting tool may be, for example, a drill, an end mill, a throwaway tip for a drill, a throwaway tip for an end mill, a throwaway tip for milling, a throwaway tip for turning, a metal saw, a gear cutting tool, a reamer, and a tap.

<Substrate>

Any conventionally known substrate of this kind can be employed as the substrate in the present embodiment. The substrate preferably contains, for example, one selected from a group consisting of cemented carbide (for example, tungsten carbide (WC)-based cemented carbide, cemented carbide containing not only WC but also Co, or cemented carbide containing not only WC but also carbonitride of Cr, Ti, Ta, or Nb as added), cermet (mainly composed of TiC, TiN, or TiCN), high-speed steel, ceramics (titanium carbide, silicon carbide, silicon nitride, aluminum nitride, or aluminum oxide), a cubic boron nitride sintered material (cBN sintered material), and a diamond sintered material.

Among these various substrates, in particular, WC-based cemented carbide or cermet (in particular, TiCN-based cermet) is preferably selected. This is because such substrates are particularly excellent in balance between hardness and strength at a high temperature and have characteristics excellent as a substrate for the cutting tool in applications above.

FIG. 1 is a perspective view illustrating one manner of a substrate of a cutting tool. A cutting tool in such a shape is used as a throwaway tip for turning.

A substrate 11 shown in FIG. 1 includes surfaces including an upper surface, a lower surface, and four side surfaces, and it is in a shape of a quadrangular prism slightly smaller in vertical dimension as a whole. Substrate 11 is provided with a through hole that extends from the upper surface to the lower surface. At boundaries of the four side surfaces, adjacent side surfaces are connected to each other with an arc-shaped surface being interposed.

In substrate 11, the upper surface and the lower surface each serve as a rake face 1a, four side surfaces (and the arc-shaped surface that connects the side surfaces to each other) each serve as a flank face 1b, and the arc-shaped surface that connects rake face 1a and flank face 1b to each other serves as a cutting edge portion 1c. The "rake face" means a face where chips from a work material are raked. The "flank face" means a face partly in contact with a work material. The cutting edge portion is included in a portion serving as a cutting edge of the cutting tool.

When the cutting tool is a throwaway chip, substrate 11 may be in a shape with or without a chip breaker. Cutting edge portion 1c may be in any shape of a sharp edge (a ridge at which a rake face and a flank face intersect with each other), a honed shape (a sharp edge provided with R), a negative land (a beveled shape), and a honed shape and a negative land as being combined.

Though the shape and the designation of each part of substrate 11 are described above with reference to FIG. 1, terms the same as above are used for referring to a shape and a designation of each part corresponding to substrate 11 in the cutting tool according to the present embodiment. The cutting tool includes the rake face, the flank face, and the cutting edge portion that connects the rake face and the flank face to each other.

<Coating>

The coating according to the present embodiment includes an α-Al$_2$O$_3$ layer provided on the substrate. The "coating" performs a function to improve various characteristics such as chipping resistance and wear resistance of the cutting tool by covering at least a part of the substrate (for example, a part of the rake face). The coating preferably covers not only a part of the substrate but also the entire surface of the substrate. A part of the substrate not covered with the coating or a partially different construction of the coating, however, is within the scope of the present embodiment.

The coating preferably has a thickness not smaller than 1 μm and not larger than 30 μm. The thickness of the coating means a total of thicknesses of layers that constitute the coating such as an α-Al$_2$O$_3$ layer, an intermediate layer, an outermost layer, and other layers (for example, an underlying layer and a hard layer) which will be described later. The thickness of the coating can be measured, for example, by conducting measurement in a cross-section of the cutting tool with an optical microscope at a magnification of 1000×. Specifically, the thickness can be measured by conducting measurement at any three points in the cross-section and calculating an average value of thicknesses at the three points. This is also applicable to measurement of a thickness of each of the α-Al$_2$O$_3$ layer, the intermediate layer, the outermost layer, and other layers which will be described later.

(α-Al$_2$O$_3$ Layer)

The α-Al$_2$O$_3$ layer in the present embodiment contains α-Al$_2$O$_3$ (aluminum oxide with a crystal structure) crystal grains (which may simply be referred to as "crystal grains" below). The α-Al$_2$O$_3$ layer is a layer containing polycrystalline α-Al$_2$O$_3$.

The α-Al$_2$O$_3$ layer may contain an inevitable impurity so long as an effect achieved by the cutting tool according to the present embodiment is not impaired.

Figure 2:
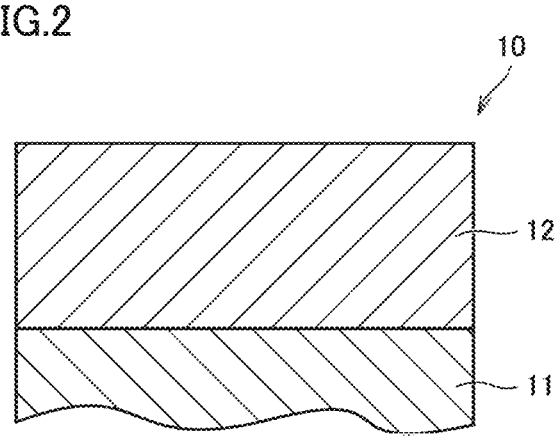
FIG. 2 is a schematic cross-sectional view of the cutting tool in one manner of the present embodiment.
Figure 5:
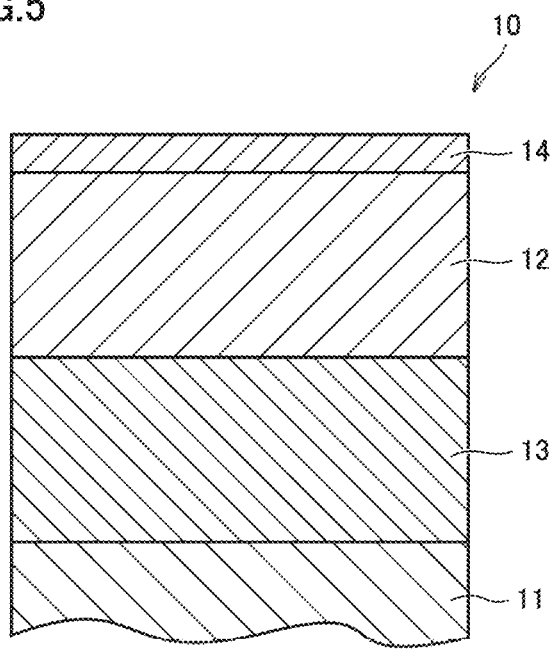
FIG. 5 is a schematic cross-sectional view of a cutting tool in another manner of the present embodiment.

The α-Al$_2$O$_3$ layer may be provided directly on the substrate (for example, FIG. 2) or on the substrate with another layer such as an underlying layer, a hard layer, or an intermediate layer which will be described later being interposed (for example, FIG. 5) so long as an effect achieved by the cutting tool according to the present embodiment is not impaired. Another layer such as an outermost layer may be provided on the α-Al$_2$O$_3$ layer (for example, FIG. 5). The α-Al$_2$O$_3$ layer may serve as the outermost layer of the coating.

In the present embodiment, the α-Al$_2$O$_3$ layer has a thickness preferably not smaller than 1 μm and not larger than 20 μm and more preferably not smaller than 3 and not larger than 10 μm. An effect of further excellent wear resistance can thus be exhibited. The thickness can be measured, for example, by conducting measurement in a cross-section of the cutting tool with an optical microscope at a magnification of 1000× as described above.

The α-Al$_2$O$_3$ layer of the cutting tool has orientation index TC(0 0 12) of the (0 0 12) plane expressed in the expression (1) not smaller than 4 and not larger than 8.5, orientation index TC(2 0 14) of the (2 0 14) plane expressed in the expression (2) not smaller than 0.5 and not larger than 3, and a total of orientation index TC(0 0 12) and orientation index TC(2 0 14) not larger than 9.

In the expressions (1) and (2), I(h k l) represents X-ray diffraction intensity found in XRD measurement (X-ray diffraction measurement) at an (h k l) plane. The X-ray diffraction intensity means a height of a peak in a diffraction chart obtained by XRD measurement. I$_0$(h k l) represents standard intensity at the (h k l) plane of α-Al$_2$O$_3$ shown in 010-0173 of JCPDS card. The (h k l) plane refers to any of nine planes of the (0 1 2) plane, the (1 0 4) plane, the (1 1 0) plane, the (1 1 3) plane, the (0 2 4) plane, the (1 1 6) plane, the (3 0 0) plane, the (0 0 12) plane, and the (2 0 14) plane.

Figure 3:
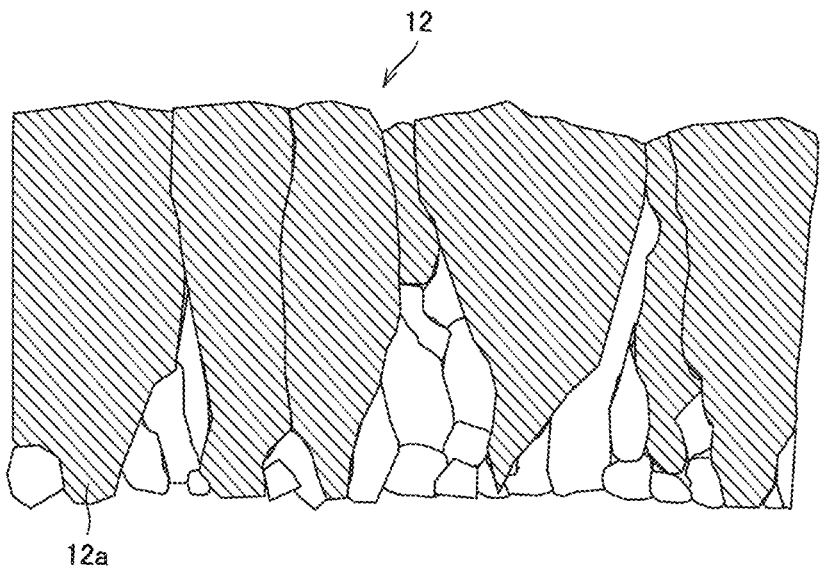
FIG. 3 is a schematic cross-sectional view showing a texture structure in a conventional $\alpha$-$Al_2O_3$ layer.

The α-Al$_2$O$_3$ layer has conventionally been considered as being preferably high in content of crystal grains with the (0 0 1) orientation. In other words, the α-Al$_2$O$_3$ layer has been considered as being ideally composed of crystal grains 12a (columnar crystals 12a) with the (0 0 1) orientation as shown in FIG. 3. In order for the cutting tool to sufficiently benefit from improvement in wear resistance owing to the α-Al$_2$O$_3$ layer, however, in parallel to the above, improvement in chipping resistance owing to the α-Al$_2$O$_3$ layer (in particular, improvement in resistance against force applied to the coating in the direction perpendicular to an interface (a main surface) of the α-Al$_2$O$_3$ layer during cutting) is also important.

Figure 4:
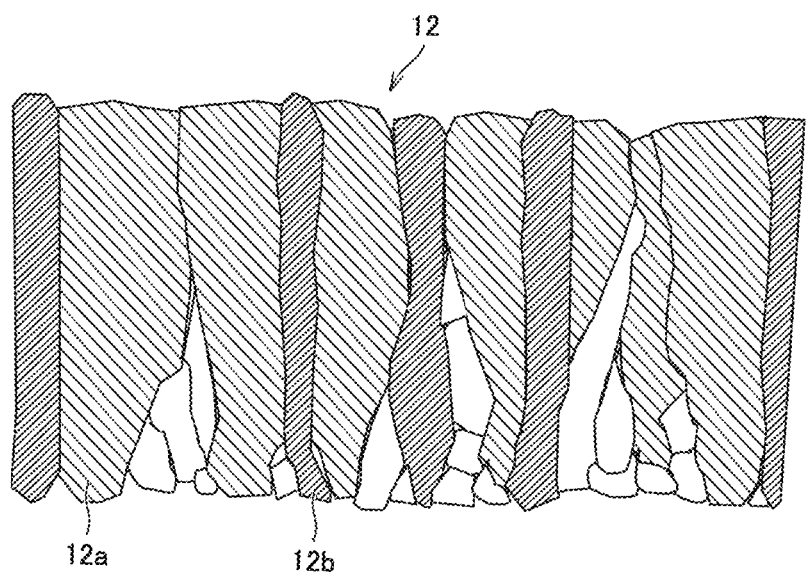
FIG. 4 is a schematic cross-sectional view showing a texture structure in an $\alpha$-$Al_2O_3$ layer in the present embodiment.

The present inventors have conducted dedicated studies for solving the problem above, and found for the first time that presence of crystal grains 12b (columnar crystals 12b) with (2 0 14) orientation at a prescribed ratio among crystal grains 12a (columnar crystals 12a) with (0 0 1) orientation (for example, FIG. 4) improves resistance against development of a crack due to force in the direction perpendicular to the interface of the α-Al$_2$O$_3$ layer. In addition, the present inventors have studied relation between a ratio of presence of crystal grains 12a with (0 0 1) orientation and crystal grains 12b with (2 0 14) orientation and an orientation index, and have found that the orientation index of crystal grains 12a with (0 0 1) orientation and crystal grains 12b with (2 0 14) orientation serves as an indicator that reflects the ratio of presence (a volume ratio) of crystal grains 12a with (0 0 1) orientation and crystal grains 12b with (2 0 14) orientation and that orientation index TC(0 0 12) of the (0 0 12) plane expressed in the expression (1) is not smaller than 4 and not larger than 8.5 and orientation index TC(2 0 14) of the (2 0 14) plane expressed in the expression (2) is not smaller than 0.5 and not larger than 3. With improvement in resistance against development of a crack, the cutting tool is excellent in wear resistance and chipping resistance.

In discussing an orientation of crystal grains herein, the orientation corresponding to the (0 0 12) plane is expressed as "(0 0 1) orientation" because the orientation corresponding to the (0 0 12) plane is the same as the orientation corresponding to the (0 0 1) plane. In discussing the orientation index, on the other hand, the orientation index is expressed as a Miller index of a crystal plane corresponding to that orientation index such as "TC(0 0 12)".

Orientation index TC(0 0 12) can be found, for example, in XRD measurement conducted under conditions below. Specifically, X-ray diffraction measurement is conducted at any one point on the α-Al$_2$O$_3$ layer and the orientation index of the (0 0 12) plane calculated based on the expression (1) is defined as orientation index TC(0 0 12) in the α-Al$_2$O$_3$ layer. In selecting "any one point" described above, a point where an abnormal value is apparently exhibited is excluded. In the present embodiment, the present inventors assume that, even though orientation indices TC(0 0 12) at a plurality of points on the α-Al$_2$O$_3$ layer are found, no significant difference will be observed, because the α-Al$_2$O$_3$ layer is highly uniform. Orientation index TC(2 0 14) can also be found with a method the same as above. When an outermost layer is formed on the α-Al$_2$O$_3$ layer, XRD measurement is conducted after the outermost layer is polished to expose the α-Al$_2$O$_3$ layer.

(Conditions for X-Ray Diffraction Measurement)

| | |
|---|---|
| X-ray output | 45 kV, 200 mA |
| X-ray source and wavelength | CuKα, 1.541862 Å |
| Detector | D/teX Ultra 250 |
| Scan axis | 2θ/θ |
| Longitudinal restriction slit width | 2.0 mm |

-continued

| Scan mode | CONTINUOUS |
|---|---|
| Scan speed | 20°/min. |

Orientation index TC(2 0 14) is preferably not smaller than 1 and not larger than 2.5 and more preferably not smaller than 1.7 and not larger than 2.2.

Orientation index TC(0 0 12) is preferably not smaller than 4.5 and not larger than 7.5 and more preferably not smaller than 5 and not larger than 7.5.

(Intermediate Layer)

The coating preferably further includes an intermediate layer provided between the substrate and the $\alpha\text{-Al}_2\text{O}_3$ layer. The intermediate layer preferably contains an oxycarbide, an oxycarbonitride, or a boronitride containing titanium (Ti) as a constituent element. Thus, adhesiveness of the $\alpha\text{-Al}_2\text{O}_3$ layer of the coating is improved and wear resistance is effectively improved. In one aspect of the present embodiment, the intermediate layer is preferably composed of one compound selected from the group consisting of the oxycarbide, the oxycarbonitride, and the boronitride containing Ti as the constituent element. In other words, the intermediate layer is preferably composed of a compound expressed as TiCO, TiCNO, or TiBN. The intermediate layer is preferably a TiCNO layer (a layer composed of a compound expressed as TiCNO).

The intermediate layer may contain an inevitable impurity so long as an effect achieved by the cutting tool according to the present embodiment is not impaired.

The intermediate layer has a thickness preferably not larger than 2 μm and more preferably not smaller than 0.5 μm and not larger than 1.5 μm. The thickness can be measured, for example, by conducting measurement in a cross-section of the cutting tool with an optical microscope at a magnification of 1000× as described above.

(Outermost Layer)

The coating preferably further includes an outermost layer formed on the $\alpha\text{-Al}_2\text{O}_3$ layer. By doing so, the cutting tool is excellent in identifiability of the coating in addition to wear resistance. The outermost layer is preferably composed of a compound expressed as TiC, TiN, or TiCN. As the outermost layer is composed of the compound expressed as TiC, TiN, or TiCN, toughness of the coating is improved.

The outermost layer may contain an inevitable impurity so long as an effect achieved by the cutting tool according to the present embodiment is not impaired.

The outermost layer has a thickness preferably not smaller than 0.1 μm and not larger than 2 μm and more preferably not smaller than 0.3 μm and not larger than 0.6 μm. The thickness can be measured, for example, by conducting measurement in a cross-section of the cutting tool with an optical microscope at a magnification of 1000× as described above.

(Other Layers)

The coating may further include other layers so long as an effect in the present embodiment is not impaired. Examples of other layers include an underlying layer provided directly on the substrate and a hard layer provided between the underlying layer and the intermediate layer. The hard layer may be different in composition from the intermediate layer. By including the underlying layer, the coating achieves improved adhesiveness to the substrate. Examples of the underlying layer include a layer composed of TiN. By including the hard layer, the coating achieves further improved wear resistance. Examples of the hard layer include a layer composed of TiCN.

<<Method of Manufacturing Surface-Coated Cutting Tool>>

A method of manufacturing a cutting tool according to the present embodiment is a method of manufacturing the cutting tool above, and the method includes the steps of preparing the substrate (which is referred to as a "first step" below), generating a nucleus of $\alpha\text{-Al}_2\text{O}_3$ on the substrate (which is referred to as a "second step" below), and growing crystal of $\alpha\text{-Al}_2\text{O}_3$ from the nucleus of $\alpha\text{-Al}_2\text{O}_3$ (which is referred to as a "third step" below), the second step being performed by chemical vapor deposition and including supply of source material gas containing $C_3H_8$ gas and $H_2S$ gas. Each step will be described below.

<First Step>

In the first step, the substrate is prepared. As described above, any conventionally known substrate of this kind can be employed as the substrate. In preparing the substrate, a commercially available product may be purchased or the substrate may be manufactured from a source material. For example, when the substrate is composed of cemented carbide, the substrate composed of cemented carbide can be obtained by uniformly mixing source material powders formulated (mass %) as described in Example which will be described later by using a commercially available attritor, then forming by compression, the mixed powders into a prescribed shape (for example, a part number CNMG 120408N-UX manufactured by Sumitomo Electric Hardmetal Corp.), and thereafter sintering the mixed powders in a prescribed sintering furnace at a temperature from 1300 to at most 1500° C. for one to two hours. "CNMG 120408N-UX" mentioned above refers to a shape of a throwaway chip for turning (see, for example, FIG. 1).

<Second Step>

In the second step, a nucleus of $\alpha\text{-Al}_2\text{O}_3$ is generated on the substrate. The second step is performed by chemical vapor deposition, and includes supply of source material gas containing $C_3H_8$ gas and $H_2S$ gas.

When "a nucleus of $\alpha\text{-Al}_2\text{O}_3$ is generated on the substrate," a nucleus of $\alpha\text{-Al}_2\text{O}_3$ should only be generated on an upper side of the substrate. In other words, the nucleus of $\alpha\text{-Al}_2\text{O}_3$ may be generated directly on the substrate or on the substrate with another layer such as an underlying layer, a hard layer, or an intermediate layer being interposed.

A method of generating a nucleus of $\alpha\text{-Al}_2\text{O}_3$ on the substrate is performed by chemical vapor deposition (CVD), and the nucleus of $\alpha\text{-Al}_2\text{O}_3$ is generated by supplying source material gas containing $C_3H_8$ gas and $H_2S$ gas. In other words, the second step is performed by chemical vapor deposition and includes supply of source material gas containing $C_3H_8$ gas and $H_2S$ gas. The "source material gas" in the second step means source material gas for generating a nucleus of $\alpha\text{-Al}_2\text{O}_3$.

Conventionally, $C_3H_8$ gas has been used for generating a carbide in a layer other than the $\alpha\text{-Al}_2\text{O}_3$ layer of the coating. The present inventors have found for the first time, use of $C_3H_8$ gas for generating a nucleus of $\alpha\text{-Al}_2\text{O}_3$ on the substrate for the purpose of controlling orientation of the $\alpha\text{-Al}_2\text{O}_3$ layer. The present inventors consider above-described $C_3H_8$ gas as functioning as a catalyst because it does not affect a composition of the nucleus of $\alpha\text{-Al}_2\text{O}_3$ which is a generated phase.

Specifically, initially, $CO_2$, $C_3H_8$, HCl, $AlCl_3$, $H_2S$, and $H_2$ are used as source material gas. The source material gas may contain, for example, 0.5 to 2 volume % of $CO_2$, 0.1 to 2 volume % of $C_3H_8$, 0.5 to 4 volume % of HCl, 5 to 13 volume % of $AlCl_3$, 0.1 to 3 volume % of $H_2S$, and $H_2$ as a remainder.

A temperature in a reaction vessel during reaction in the second step is preferably from 970° C. to 1030° C.

A pressure in the reaction vessel during reaction in the second step is preferably from 80 hPa to 150 hPa.

A total flow rate of gas during reaction in the second step is preferably from 30 L/min. to 100 L/min.

A reaction time period in the second step is preferably from two minutes to sixty minutes and more preferably from five minutes to forty minutes.

<Third Step>

In the third step, crystal of $\alpha\text{-}Al_2O_3$ is grown from the nucleus of $\alpha\text{-}Al_2O_3$. A method of growing crystal of $\alpha\text{-}Al_2O_3$ from the nucleus of $\alpha\text{-}Al_2O_3$ is performed by CVD.

Specifically, initially, $CO_2$, HCl, $AlCl_3$, $H_2S$, and $H_2$ are used as source material gas. The source material gas may contain, for example, 0.5 to 3 volume % of $CO_2$, 4 to 6 volume % of HCl, 5 to 13 volume % of $AlCl_3$, 0.1 to 3 volume % of $H_2S$, and $H_2$ as a remainder.

A temperature in the reaction vessel during reaction in the third step is preferably from 950° C. to 1050° C.

A pressure in the reaction vessel during reaction in the third step is preferably from 10 hPa to 80 hPa.

A total flow rate of gas during reaction in the third step is preferably from 30 L/min. to 100 L/min.

A reaction time period in the third step can be changed as appropriate depending on a thickness of the formed $\alpha\text{-}Al_2O_3$ layer.

<Other Steps>

In the manufacturing method according to the present embodiment, in addition to the steps described above, other steps may be performed as appropriate so long as an effect of the present embodiment is not impaired.

In the present embodiment, before the second step, a step of forming an underlying layer, a hard layer, or an intermediate layer on the substrate may be included. In the present embodiment, after the third step, a step of forming an outermost layer on the $\alpha\text{-}Al_2O_3$ layer may be included.

When an underlying layer, a hard layer, an intermediate layer, or an outermost layer described above is formed, each layer may be formed by a conventional method.

The description above includes features additionally described below.

(Additional Aspect 1)

A surface-coated cutting tool includes a substrate and a coating that covers the substrate, the coating includes an $\alpha\text{-}Al_2O_3$ layer, and the $\alpha\text{-}Al_2O_3$ layer has orientation index TC(0 0 12) of a (0 0 12) plane expressed in an expression (1) below not smaller than 4 and not larger than 8.5, orientation index TC(2 0 14) of a (2 0 14) plane expressed in an expression (2) below not smaller than 0.5 and not larger than 3, and a total of orientation index TC(0 0 12) and orientation index TC(2 0 14) not larger than 9

$$TC(0\ 0\ 12) = \frac{I(0\ 0\ 12)}{I_0(0\ 0\ 12)} \left\{ \frac{1}{9} \sum_{n=1}^{9} \frac{I(h\ k\ l)}{I_0(h\ k\ l)} \right\}^{-1} \quad (1)$$

$$TC(2\ 0\ 14) = \frac{I(2\ 0\ 14)}{I_0(2\ 0\ 14)} \left\{ \frac{1}{9} \sum_{n=1}^{9} \frac{I(h\ k\ l)}{I_0(h\ k\ l)} \right\}^{-1} \quad (2)$$

(where I(h k l) represents X-ray diffraction intensity found in XRD measurement at an (h k l) plane, $I_0$(h k l) represents standard intensity at the (h k l) plane of $\alpha\text{-}Al_2O_3$ shown in 010-0173 of JCPDS card, and the (h k l) plane refers to any of nine planes of a (0 1 2) plane, a (1 0 4) plane, a (1 1 0) plane, a (1 1 3) plane, a (0 2 4) plane, a (1 1 6) plane, a (3 0 0) plane, the (0 0 12) plane, and the (2 0 14) plane).

(Additional Aspect 2)

The surface-coated cutting tool described in additional aspect 1, wherein orientation index TC(2 0 14) is not smaller than 1 and not larger than 2.5.

(Additional Aspect 3)

The surface-coated cutting tool described in additional aspect 1 or 2, wherein the $\alpha\text{-}Al_2O_3$ layer has a thickness not smaller than 1 µm and not larger than 20 µm.

(Additional Aspect 4)

The surface-coated cutting tool described in any of additional aspects 1 to 3, wherein the coating further includes an intermediate layer provided between the substrate and the $\alpha\text{-}Al_2O_3$ layer, and the intermediate layer contains an oxycarbide, an oxycarbonitride, or a boronitride containing Ti as a constituent element.

(Additional Aspect 5)

The surface-coated cutting tool described in any of additional aspects 1 to 4, wherein the coating has a thickness not smaller than 1 µm and not larger than 30 µm.

(Additional Aspect 6)

The surface-coated cutting tool described in any of additional aspects 1 to 5, wherein the coating further includes an outermost layer formed on the $\alpha\text{-}Al_2O_3$ layer.

EXAMPLES

Though the present invention will be described in detail below with reference to Example, the present invention is not limited thereto.

<<Fabrication of Cutting Tool>>

<Preparation of Substrate>

Initially, in the first step, a substrate to be covered with a coating was prepared. Specifically, mixed powders were obtained by uniformly mixing source material powders formulated (mass %) as below by using a commercially available attritor.

Formulation of Source Material Powders

| | |
|---|---|
| Co | 7 mass % |
| $Cr_3C_2$ | 0.5 mass % |
| NbC | 3.5 mass % |
| TaC | 1.0 mass % |
| WC | remainder |

A substrate composed of cemented carbide was then obtained by forming by compression, the mixed powders into a prescribed shape (a part number CNMG 120408N-UX manufactured by Sumitomo Electric Hardmetal Corp.) and thereafter placing the obtained formed product in a sintering furnace and sintering the formed product at a temperature from 1300 to 1500° C. for one to two hours. "CNMG 120408N-UX" represents a shape of a throwaway chip for turning.

<Formation of Coating>

A coating was formed on the surface of the substrate by forming an underlying layer, a hard layer, an intermediate layer, an $\alpha\text{-}Al_2O_3$ layer, and an outermost layer shown in Table 4 in this order on the surface of the substrate. A method of fabricating each layer that makes up the coating will be described below.

(Formation of Underlying Layer, Hard Layer, and Intermediate Layer)

The underlying layer, the hard layer, and the intermediate layer were formed in this order by emitting reaction gas composed as shown in Table 1 onto the surface of the substrate under film formation conditions shown in Table 1.

TABLE 1

| Type | Composition of Reaction Gas (vol %) | Film Formation Condition | | |
|---|---|---|---|---|
| | | Pressure (kPa) | Temperature (° C.) | Gas Flow Rate (L/min) |
| Underlying Layer (TiN) | $TiCl_4$ = 2.0%, $N_2$ = 39.7%, $H_2$ = Remainder | 6.7 | 915 | 63.8 |
| Hard Layer (TiCN) | $TiCl_4$ = 2.0%, $CH_3CN$ = 0.7%, $H_2$ = Remainder | 9 | 860 | 50.5 |
| Intermediate Layer (TiCNO) | $TiCl_4$ = 2.1%, CO = 3.2%, $CH_4$ = 2.8%, $N_2$ = 23.7%, $H_2$ = Remainder | 16 | 1030 | 49.4 |

(Formation of $\alpha$-$Al_2O_3$ Layer)

A nucleus of $\alpha$-$Al_2O_3$ was generated by emitting reaction gas composed as shown in Table 2 onto the surface of the intermediate layer for a time period shown in Table 2 under film formation conditions including a pressure in the furnace of 100 hPa, a reaction temperature of 1000° C., and a gas flow rate of 70 L/min. (second step). For sample No. 12, treatment corresponding to the second step was not performed.

TABLE 2

| Sample No. | Composition of Reaction Gas | Reaction Time Period (minutes) | TC(0 0 12) | TC(2 0 14) |
|---|---|---|---|---|
| 1 | $CO_2$ 2%, $C_3H_8$ 0.5%, HCl 2%, $AlCl_3$ 10%, $H_2S$ 0.5%, $H_2$ 85% | 5 | 7.6 | 0.5 |
| 2 | $CO_2$ 2%, $C_3H_8$ 1%, HCl 2%, $AlCl_3$ 10%, $H_2S$ 0.5%, $H_2$ 84.5% | 5 | 6.5 | 1.8 |
| 3 | $CO_2$ 2%, $C_3H_8$ 0.5%, HCl 2%, $AlCl_3$ 10%, $H_2S$ 0.5%, $H_2$ 85% | 10 | 6.9 | 1.7 |
| 4 | $CO_2$ 2%, $C_3H_8$ 1%, HCl 2%, $AlCl_3$ 10%, $H_2S$ 0.5%, $H_2$ 84.5% | 10 | 5.3 | 2.3 |
| 5 | $CO_2$ 2%, $C_3H_8$ 0.5%, HCl 2%, $AlCl_3$ 10%, $H_2S$ 0.5%, $H_2$ 85% | 30 | 5.8 | 2.2 |
| 6 | $CO_2$ 2%, $C_3H_8$ 1%, HCl 2%, $AlCl_3$ 10%, $H_2S$ 0.5%, $H_2$ 84.5% | 30 | 4.2 | 3.0 |
| 7 | $CO_2$ 2%, HCl 2%, $AlCl_3$ 10%, $H_2S$ 0.5%, $H_2$ 85.5% | 5 | 7.9 | 0.1 |
| 8 | $CO_2$ 2%, HCl 2%, $AlCl_3$ 10%, $H_2S$ 0.5%, $H_2$ 85.5% | 10 | 7.2 | 0.1 |
| 9 | $CO_2$ 2%, HCl 2%, $AlCl_3$ 10%, $H_2S$ 0.5%, $H_2$ 85.5% | 30 | 6.8 | 0.1 |
| 10 | $CO_2$ 2%, $C_3H_8$ 0.5%, HCl 2%, $AlCl_3$ 10%, $H_2$ 85.5% | 10 | 3.5 | 3.6 |
| 11 | $CO_2$ 2%, $C_3H_8$ 1%, HCl 2%, $AlCl_3$ 10%, $H_2$ 85% | 10 | 2.8 | 4.0 |
| 12 | — | 0 | 4.1 | 0.1 |

Then, crystal of $\alpha$-$Al_2O_3$ was grown by emitting reaction gas composed as shown below onto the nucleus of $\alpha$-$Al_2O_3$ on the intermediate layer under film formation conditions including a pressure in the furnace of 35 hPa, a reaction temperature of 1000° C., and a gas flow rate of 70 L/min. (third step). The $\alpha$-$Al_2O_3$ layer was formed in a procedure above.

Reaction Gas Composition in Third Step
$CO_2$: 2 volume %
HCl: 4 volume %
$AlCl_3$: 10 volume %
$H_2S$: 0.5 volume %
$H_2$: remainder (Formation of Outermost Layer)

The outermost layer was formed by emitting reaction gas composed as shown in Table 3 onto the surface of the $\alpha$-$Al_2O_3$ layer under film formation conditions shown in Table 3.

TABLE 3

| Type | Composition of Reaction Gas (vol %) | Film Formation Condition | | |
|---|---|---|---|---|
| | | Pressure (kPa) | Temperature (° C.) | Gas Flow Rate (L/min) |
| Outermost Layer (TiN) | $TiCl_4$ = 0.5%, $N_2$ = 41.2%, $H_2$ = Remainder | 6.7 | 1050 | 75.5 |

Cutting tools of samples Nos. 1 to 12 were fabricated in the procedure above. The cutting tools of samples Nos. 1 to 6 correspond to Example. The cutting tools of samples Nos. 7 to 12 correspond to Comparative Example.

<<Evaluation of Characteristics of Cutting Tool>>
<Measurement of Orientation Index>

With the use of the cutting tools of samples Nos. 1 to 12 fabricated as above, the orientation index of each orientation plane of the $\alpha$-$Al_2O_3$ layer of each cutting tool was measured by X-ray diffraction measurement. Measurement was conducted under conditions below. Initially, the $\alpha$-$Al_2O_3$ layer was exposed by polishing the outermost layer formed on the $\alpha$-$Al_2O_3$ layer. Then, the orientation index of each orientation plane was found by conducting X-ray diffraction measurement at any one point on the $\alpha$-$Al_2O_3$ layer. Table 2 shows results with attention being paid to orientation index TC(0 0 12) and orientation index TC(2 0 14). Though orientation index TC(0 0 12) and an orientation index TC(2 0 14) were found at a plurality of points on the $\alpha$-$Al_2O_3$ layer, no significant difference was observed.

(Conditions for X-Ray Diffraction Measurement)

| | |
|---|---|
| X-ray output | 45 kV, 200 mA |
| X-ray source and wavelength | CuK$\alpha$, 1.541862 Å |
| Detector | D/teX Ultra 250 |
| Scan axis | 2θ/θ |
| Longitudinal restriction slit width | 2.0 mm |
| Scan mode | CONTINUOUS |
| Scan speed | 20°/min. |

<Measurement of Thickness of Coating>

A thickness of the coating and each of the underlying layer, the hard layer, the intermediate layer, the $\alpha$-$Al_2O_3$ layer, and the outermost layer that made up the coating was found from a cross-sectional sample in parallel to a direction of normal to the surface of the substrate with the use of an optical microscope. Table 4 shows results.

<<Cutting Test>>

A cutting test below was conducted with the use of the cutting tools of samples Nos. 1 to 12 fabricated as above.

<Wear Resistance Test>

For the cutting tools of samples Nos. 1 to 12, a time period of cutting until an amount of wear of the flank face (Vb) reached 0.2 mm under cutting conditions below was counted and life of the tool was evaluated. Table 5 shows results. A longer time period of cutting indicates better wear resistance of the cutting tool and the cutting tool can be evaluated as being highly likely to be longer in life.

(Cutting Conditions in Wear Resistance Test)
Work material: S45C round rod
Peripheral speed: 280 m/min.
Feed rate: 0.15 mm/rev
Cutting depth: 1.0 mm
Coolant: none <Chipping Resistance Test>

For the cutting tools of samples Nos. 1 to 12, the number of times of impact until the cutting tool was chipped was counted under cutting conditions below and life of the tool was evaluated. Whether or not the cutting tool was chipped was checked every one thousand times of impact. Table 5 shows results. A larger number of times of impact indicates better chipping resistance of the cutting tool and the cutting tool can be evaluated as being highly likely to be longer in life.

(Cutting Conditions in Chipping Resistance Test)
Work material: SCM440 material (with eight grooves)
Peripheral speed: 280 m/min.
Feed rate: 0.2 mm/rev
Cutting depth: 2.0 mm
Coolant: none

TABLE 4

| Sample No. | Construction of Coating | | | | | Total Thickness of Coating (μm) |
|---|---|---|---|---|---|---|
| | Underlying Layer (μm) | Hard Layer (μm) | Intermediate Layer (μm) | $\alpha$-$Al_2O_3$ Layer (μm) | Outermost Layer (μm) | |
| 1 | 0.2 | 7.8 | 1.4 | 6.2 | 0.6 | 16.2 |
| 2 | 0.3 | 8.0 | 1.5 | 6.4 | 0.5 | 16.7 |
| 3 | 0.4 | 8.4 | 1.2 | 6.3 | 0.5 | 16.8 |
| 4 | 0.2 | 7.9 | 1.3 | 6.2 | 0.4 | 16.0 |
| 5 | 0.4 | 7.6 | 1.3 | 6.8 | 0.6 | 16.7 |
| 6 | 0.4 | 8.5 | 1.3 | 6.6 | 0.4 | 17.2 |
| 7 | 0.3 | 8.2 | 1.4 | 6.5 | 0.5 | 16.9 |
| 8 | 0.3 | 8.0 | 1.3 | 6.8 | 0.4 | 16.8 |
| 9 | 0.2 | 8.1 | 1.2 | 6.9 | 0.4 | 16.8 |
| 10 | 0.4 | 8.2 | 1.3 | 6.5 | 0.5 | 16.9 |
| 11 | 0.3 | 8.4 | 1.3 | 6.3 | 0.4 | 16.7 |
| 12 | 0.3 | 8.6 | 1.4 | 6.2 | 0.3 | 16.8 |

TABLE 5

| Sample No. | Time Period of Cutting in Wear Resistance Test (minutes) | The Number of Times of Impact in Chipping Resistance Test (counts) |
|---|---|---|
| 1 | 63 | 20000 |
| 2 | 60 | 22000 |
| 3 | 61 | 23000 |
| 4 | 57 | 23000 |
| 5 | 55 | 22000 |
| 6 | 52 | 20000 |
| 7 | 60 | 15000 |
| 8 | 58 | 16000 |
| 9 | 53 | 16000 |
| 10 | 35 | 15000 |
| 11 | 27 | 15000 |
| 12 | 41 | 16000 |

It was found from the results of the cutting test described above that the cutting tools (samples Nos. 1 to 6) having orientation index TC(0 0 12) in the α-Al$_2$O$_3$ layer not smaller than 4 and not larger than 8.5 and orientation index TC(2 0 14) not smaller than 0.5 and not larger than 3 achieved the time period of cutting in the wear resistance test not shorter than fifty minutes and the number of times of impact in the chipping resistance test not smaller than 20000. The cutting tools (samples Nos. 7 to 9 and 12) having orientation index TC(2 0 14) in the α-Al$_2$O$_3$ layer smaller than 0.5 achieved the number of times of impact in the chipping resistance test not larger than 16000. The cutting tools (samples Nos. 10 and 11) having orientation index TC(0 0 12) in the α-Al$_2$O$_3$ layer smaller than 4 achieved the time period of cutting in the wear resistance test not longer than forty minutes and the number of times of impact in the chipping resistance test not larger than 15000.

It was found from the results above that the cutting tool having orientation index TC(0 0 12) in the α-Al$_2$O$_3$ layer not smaller than 4 and not larger than 8.5 and orientation index TC(2 0 14) not smaller than 0.5 and not larger than 3 was excellent in wear resistance and also in chipping resistance.

Though the embodiment and Example of the present invention have been described as above, combination of features in each embodiment and Example described above as appropriate is also originally intended.

It should be understood that the embodiment and Example disclosed herein are illustrative and non-restrictive in every respect. The scope of the present invention is defined by the terms of the claims rather than the embodiment and Example above and is intended to include any modifications within the scope and meaning equivalent to the terms of the claims.

REFERENCE SIGNS LIST 1a rake face; 1b flank face; 1c cutting edge portion; 10 cutting tool; 11 substrate; 12 α-Al$_2$O$_3$ layer; 12a crystal grain with (0 0 1) orientation; 12b crystal grain with (2 0 14) orientation; 13 intermediate layer; 14 outermost layer

The invention claimed is:

1. A cutting tool comprising:
a substrate; and
a coating that covers the substrate,
the coating including an α-Al$_2$O$_3$ layer,
the α-Al$_2$O$_3$ layer having
   an orientation index TC(0 0 12) of a (0 0 12) plane expressed in an expression (1) below, not smaller than 4 and not larger than 8.5,
   an orientation index TC(2 0 14) of a (2 0 14) plane expressed in an expression (2) below, not smaller than 0.5 and not larger than 3, and
   a total of the orientation index TC(0 0 12) and the orientation index TC(2 0 14) not larger than 9

$$TC(0\ 0\ 12) = \frac{I(0\ 0\ 12)}{I_0(0\ 0\ 12)} \left\{ \frac{1}{9} \sum_{n=1}^{9} \frac{I(h\ k\ l)}{I_0(h\ k\ l)} \right\}^{-1} \quad (1)$$

$$TC(2\ 0\ 14) = \frac{I(2\ 0\ 14)}{I_0(2\ 0\ 14)} \left\{ \frac{1}{9} \sum_{n=1}^{9} \frac{I(h\ k\ l)}{I_0(h\ k\ l)} \right\}^{-1} \quad (2)$$

where I(h k l) represents X-ray diffraction intensity found in XRD measurement at an (h k l) plane, I$_0$(h k l) represents standard intensity at the (h k l) plane of α-Al$_2$O$_3$ shown in 010-0173 of JCPDS card, and the (h k l) plane refers to any of nine planes of a (0 1 2) plane, a (1 0 4) plane, a (1 1 0) plane, a (1 1 3) plane, a (0 2 4) plane, a (1 1 6) plane, a (3 0 0) plane, the (0 0 12) plane, and the (2 0 14) plane.

2. The cutting tool according to claim 1, wherein the orientation index TC(2 0 14) is not smaller than 1 and not larger than 2.5.

3. The cutting tool according to claim 1, wherein the α-Al$_2$O$_3$ layer has a thickness not smaller than 1 μm and not larger than 20 μm.

4. The cutting tool according to claim 1, wherein the coating further includes an intermediate layer provided between the substrate and the α-Al$_2$O$_3$ layer, and the intermediate layer contains an oxycarbide, an oxycarbonitride, or a boronitride containing titanium as a constituent element.

5. The cutting tool according to claim 1, wherein the coating has a thickness not smaller than 1 μm and not larger than 30 μm.

6. The cutting tool according to claim 1, wherein the coating further includes an outermost layer formed on the α-Al$_2$O$_3$ layer.

* * * * *